United States Patent
Chandler et al.

(10) Patent No.: US 7,920,045 B2
(45) Date of Patent: Apr. 5, 2011

(54) SURFACE MOUNTABLE PPTC DEVICE WITH INTEGRAL WELD PLATE

(75) Inventors: Daniel A. Chandler, Menlo Park, CA (US); Matthew P. Galla, San Francisco, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 919 days.

(21) Appl. No.: 10/802,127

(22) Filed: Mar. 15, 2004

(65) Prior Publication Data

US 2005/0200447 A1    Sep. 15, 2005

(51) Int. Cl.
*H01C 7/10* (2006.01)

(52) U.S. Cl. .................................................. 338/22 R

(58) Field of Classification Search .............. 338/22 R
See application file for complete search history.

(56) References Cited

U.S. PATENT DOCUMENTS

| | | |
|---|---|---|
| 4,237,441 A | 12/1980 | van Konynenburg et al. |
| 4,304,987 A | 12/1981 | van Konynenburg |
| 4,514,620 A | 4/1985 | Cheng et al. |
| 4,534,889 A | 8/1985 | van Konynenburg et al. |
| 4,545,926 A | 10/1985 | Fouts et al. |
| 4,689,475 A | 8/1987 | Matthiesen et al. |
| 4,724,417 A | 2/1988 | Au et al. |
| 4,769,901 A * | 9/1988 | Nagahori ................... 29/621 |
| 4,774,024 A | 9/1988 | Deep et al. |
| 4,800,253 A | 1/1989 | Kleiner et al. |
| 4,935,156 A | 6/1990 | van Konynenburg et al. |
| 5,039,844 A * | 8/1991 | Nagahori ................... 219/541 |
| 5,049,850 A | 9/1991 | Evans et al. |
| 5,089,801 A | 2/1992 | Chan et al. |
| 5,378,407 A | 1/1995 | Chandler et al. |
| 5,436,609 A * | 7/1995 | Chan et al. .................. 338/22 R |
| 5,451,919 A | 9/1995 | Chu et al. |
| 5,582,770 A | 12/1996 | Chu et al. |
| 5,747,147 A * | 5/1998 | Wartenberg et al. .......... 428/209 |
| 5,801,612 A | 9/1998 | Chandler et al. |
| 5,874,885 A | 2/1999 | Chandler et al. |
| 6,104,587 A * | 8/2000 | Banich et al. ................. 361/106 |

(Continued)

FOREIGN PATENT DOCUMENTS

EP    1119060 A    7/2001

(Continued)

OTHER PUBLICATIONS

European Search Report for European Application No. EP 05101981.

*Primary Examiner* — Anh T Mai
*Assistant Examiner* — Joselito Baisa

(57) ABSTRACT

A surface mount circuit protection device includes a laminar PTC resistive element having first and second major surfaces and a thickness therebetween. A first electrode layer substantially coextensive the first surface is formed of a first metal material of a type adapted to be soldered to a printed circuit substrate. A second electrode layer formed at the second major surface includes structure forming or defining a weld plate. The metal weld plate has a thermal mass and thickness capable of withstanding resistance micro spot welding of a strap interconnect without significant resultant damage to the device. The device is preferably surface mounted to a printed circuit board assembly forming a battery protection circuit connected to a battery/cell by battery strap interconnects, wherein one of the battery strap interconnects is micro spot welded to the weld plate of the device.

11 Claims, 4 Drawing Sheets

U.S. PATENT DOCUMENTS

| | | |
|---|---|---|
| 6,130,597 A | 10/2000 | Toth et al. |
| 6,358,438 B1 | 3/2002 | Isozaki et al. |
| 6,362,721 B1 | 3/2002 | Chen et al. |
| 6,518,731 B2 | 2/2003 | Thomas et al. |
| 6,570,483 B1 | 5/2003 | Chandler et al. |
| 6,713,210 B1 | 3/2004 | Sato et al. |
| 2003/0026053 A1 | 2/2003 | Toth et al. |

FOREIGN PATENT DOCUMENTS

| | | |
|---|---|---|
| JP | 5-21207 A | 1/1993 |
| JP | 6-501817 A | 2/1994 |
| JP | 10-289780 A | 10/1998 |
| JP | 10-510683 A | 10/1998 |
| JP | 2002-110403 A | 4/2002 |
| JP | 2002-527861 A | 8/2002 |
| JP | 2003-168407 A | 6/2003 |
| WO | WO-99/60637 A1 | 11/1999 |
| WO | WO-01/86664 A | 11/2001 |
| WO | WO-02/091398 A2 | 11/2002 |
| WO | WO-03/010848 A | 2/2003 |

\* cited by examiner

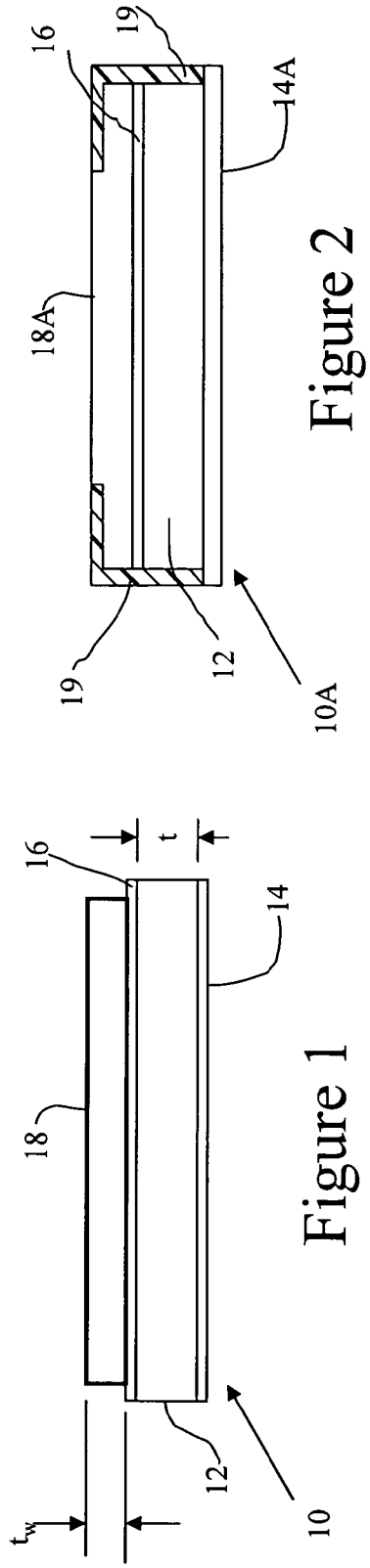
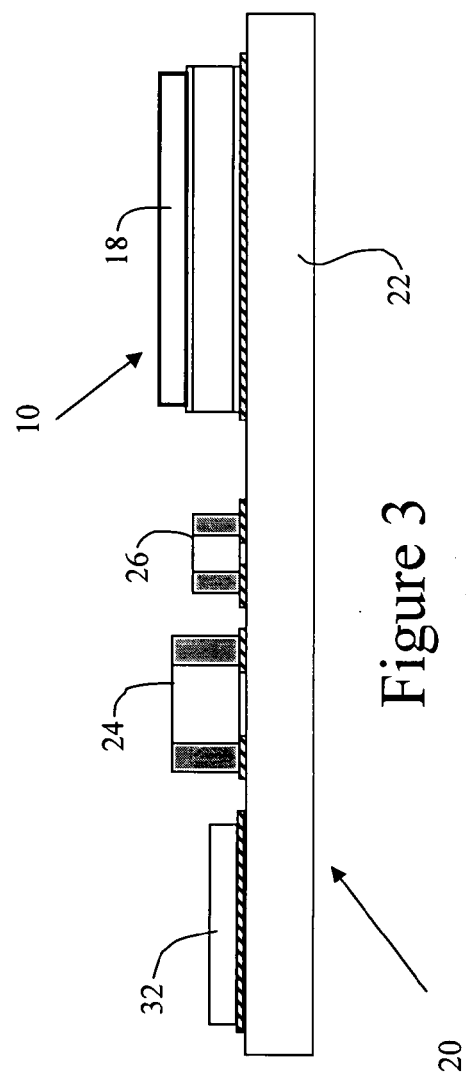

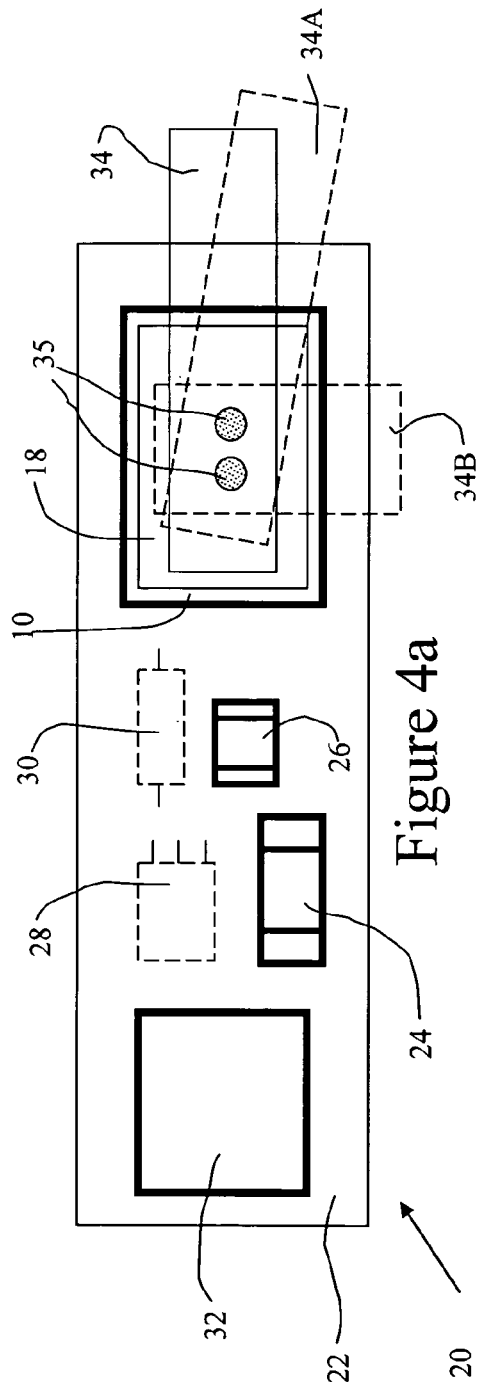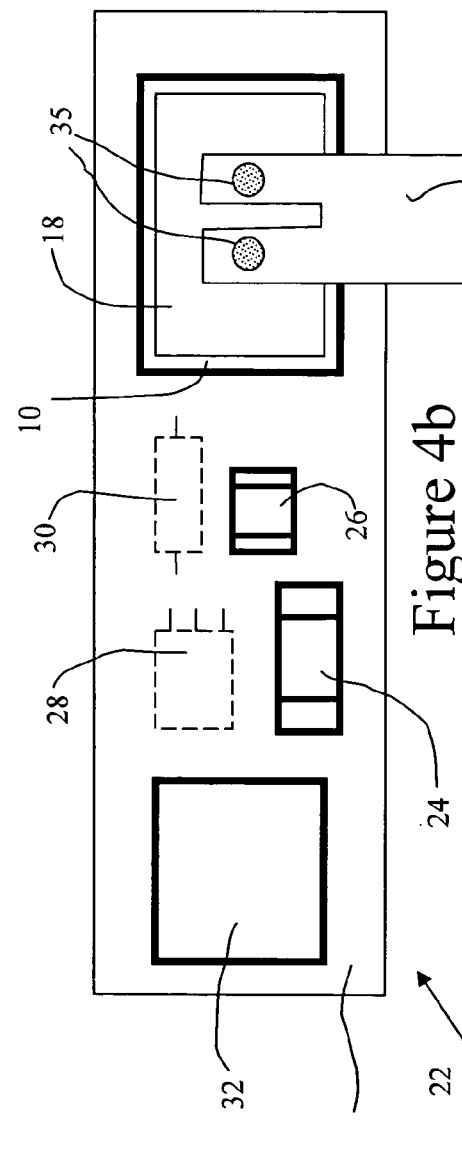

SURFACE MOUNTABLE PPTC DEVICE WITH INTEGRAL WELD PLATE

BACKGROUND OF THE INVENTION

1. Field of the Invention

The present invention relates to electrical circuit components. More particularly, the present invention relates to a surface mountable polymeric positive temperature coefficient (PPTC) device including a weld plate to which a conductor strap interconnect, e.g. an interconnect suitable for battery packs, may be resistance welded, for example.

2. Introduction to the Invention

It is known to provide an electrical cell or battery protection circuit comprising a printed circuit board and a PPTC device, which is surface-mounted to the printed circuit board. An electrical circuit formed on the printed circuit board including the PPTC device functions to regulate within a safe limit the current flow from and/or to the electrical cell or battery. In this prior arrangement an interconnect strap from the cell or battery was typically connected to a foil electrode of the PPTC device by soldering. One example of this prior approach is disclosed in International Publication No. WO99/60637 (K.K.Raychem). Another example is shown in a commonly assigned U.S. patent application Ser. No. 09/923,598, published on Feb. 6, 2003, as patent application Publication No. US2003/0026053. The disclosures of these publications are expressly incorporated herein by reference.

One drawback of the prior approach such as that disclosed in the referenced publication is that the interconnect strap from the battery was soldered to the foil electrode of the PPTC device. In some cases, the interconnect strap was connected yet again to the printed circuit board. In such devices those battery/cell interconnect straps tended to shift position or become detached when the PPTC device was heated and soldered, e.g. by reflow techniques, to the printed circuit board. In order to maintain the battery/cell interconnect strap in place during reflow operations, it was found necessary to employ a high temperature adhesive material or to provide a high temperature polymeric overmold structure to hold the strap in place.

While it would be desirable to be able to weld a battery/cell interconnect strap or battery/cell electrode directly to the PPTC device, resistance spot welding techniques practiced by users of PPTC devices must generate sufficient local heating to melt the metal and thereby fuse the strap to an underlying electrode layer of the device. Heretofore, the high temperatures required for effective welding, on the order of 1500° C. to 1600° C., have resulted in irreversible damage, or destruction of physical properties and electrical characteristics, of the PPTC material. Thus, a hitherto unsolved need has remained for a surface mountable PPTC device to which a battery/cell electrode strap could be attached by welding.

BRIEF SUMMARY OF THE INVENTION

We have discovered that resistance spot welding of battery electrode straps may be carried out by providing the PPTC device with a weld plate having sufficient thermal mass to withstand the spot welding incident without damaging the PPTC material immediately opposite the weld location, in order to protect the associated PPTC device and maintain its intended functionality during subsequent usage with the battery.

Accordingly, a general object of the present invention is to provide a surface mountable PPTC device having an integrally formed, or discretely formed and attached, weld plate to which an interconnect strap may be resistance-welded in a manner overcoming limitations and drawbacks of the prior art.

Another object of the present invention is to provide a surface mountable PPTC device to which an interconnect strap may be subsequently welded by a user in a manner providing a reliable electrical and mechanical connection which does not shift during solder reflow attachment of the PPTC device to a printed circuit board assembly, thereby enabling production and supply of the PPTC device as a separate component for assembly into electronic circuits including printed circuit boards and cells/batteries.

Another object of the present invention is to provide a surface mountable PPTC device to which an interconnect strap may be mechanically attached, and electrically connected, particularly by resistance welding, without changing, damaging or destroying the polymeric material forming the PPTC device.

In accordance with principles and aspects of the present invention, a surface mount circuit protection device includes a laminar PTC resistive element having first and second major surfaces and a thickness therebetween. A first electrode layer is formed at the first major surface and is substantially coextensive therewith. The first electrode layer is formed of a first metal material of a type adapted to be soldered to a printed circuit substrate for effecting surface mounting of the device. The protection device also includes a second electrode layer formed at the second major surface and substantially coextensive therewith. The second electrode layer includes structure forming or defining a weld plate. The weld plate is formed of a metal material, such as substantially pure nickel, and has a thermal mass capable of withstanding micro spot welding of an interconnect strap without significant resultant damage to the device. In a preferred example, the second electrode layer is formed as a metal foil layer, and the weld plate is formed separately from the second electrode layer and is attached thereto by an attachment layer of conductive material, such as solder. In one preferred example the weld plate includes a raised central mesa region and the device has an insulative box of, e.g., cured epoxy surrounding the outer edges and defining an opening exposing the raised central mesa region. In a further example, the weld plate has a minimum thickness of 0.100 mm and has a thickness in a range of 0.100 mm and 0.300 mm with a most preferred thickness of approximately 0.250 mm.

In a related aspect of the present invention a circuit protection device is a surface mounted component of a printed circuit board assembly. In this example the printed circuit board assembly forms a battery protection circuit and is mounted to and electrically connected to a battery or cell by battery interconnect straps, wherein one of two battery interconnect straps is micro spot welded to the weld plate of the circuit protection device.

These and other objects, advantages, aspects and features of the present invention will be more fully understood and appreciated upon consideration of the detailed description of preferred embodiments presented in conjunction with the following drawings.

BRIEF DESCRIPTION OF THE DRAWINGS

FIG. 1 is an enlarged view in side elevation of a circuit protection device of the present invention.

FIG. 2 is an enlarged view in side elevation and longitudinal section of an alternative embodiment of a circuit protection device of the present invention.

FIG. 3 is an enlarged view in side elevation of a battery protection circuit assembly including the FIG. 1 circuit protection device.

FIG. 4A is an enlarged top plan view of the FIG. 3 battery protection circuit assembly including the FIG. 1 circuit protection device illustrating positional tolerance of a battery strap during a spot welding operation; and FIG. 4B is a view similar to the FIG. 4A view and is illustrative of resistance micro spot welding a slotted interconnect strap to the weld plate.

DETAILED DESCRIPTION OF THE INVENTION

Figure 5:
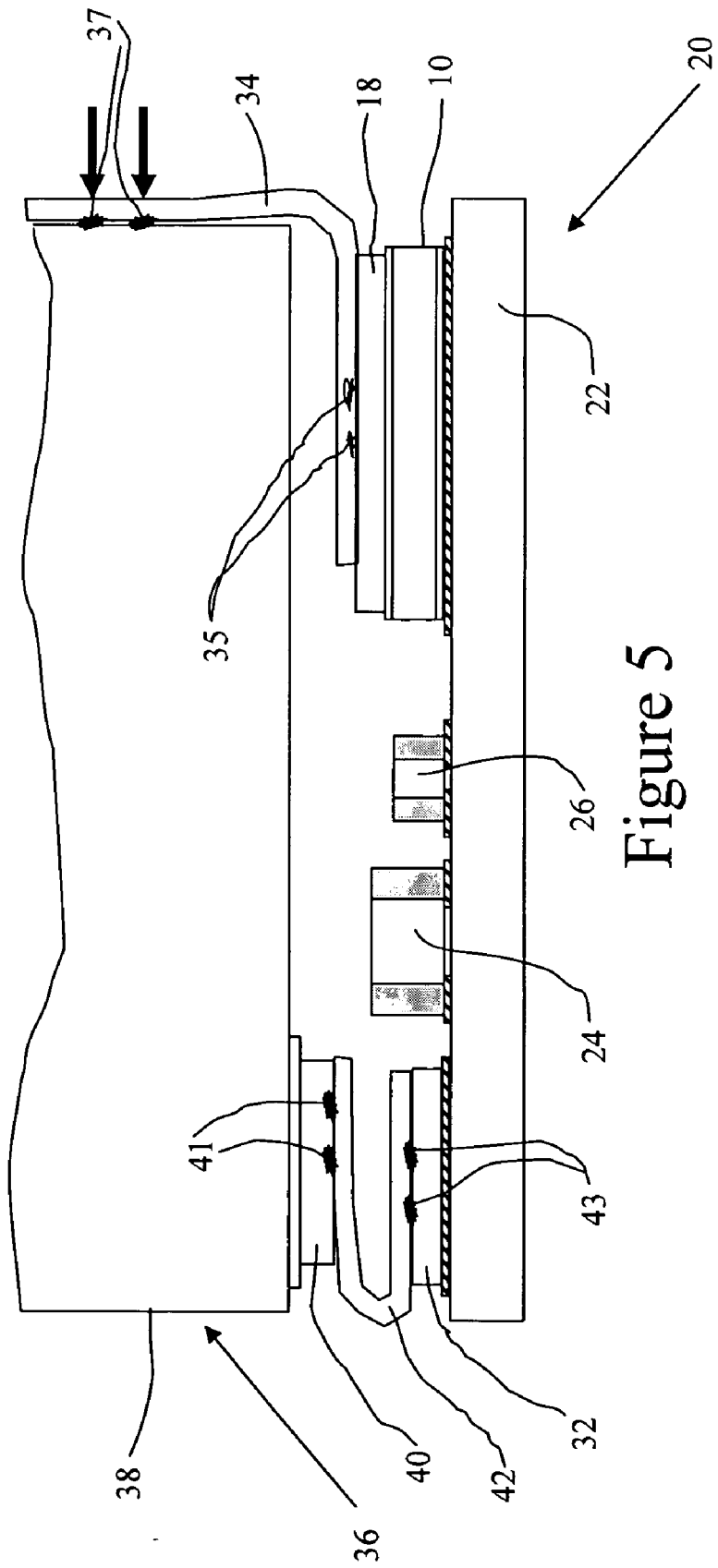
FIG. 5 is an enlarged side view in elevation showing the FIG. 4 battery protection circuit assembly after having associated battery straps connected by spot welding to anode and cathode terminals of a battery.

The circuit protection device of the present invention includes a laminar resistive element composed of a PTC material, e.g. a conductive polymer composition. Such conductive polymer compositions comprise a polymeric component, and dispersed therein, a particulate conductive filler such as metal or carbon black. Conductive polymer compositions are described in U.S. Pat. No. 4,237,441 (van Konynenburg et al.), U.S. Pat. No. 4,304,987 (van Konynenburg), U.S. Pat. No. 4,514,620 (Cheng et al.), U.S. Pat. No. 4,534,889 (van Konynenburg et al.), U.S. Pat. No. 4,545,926 (Fouts et al.), U.S. Pat. No. 4,724,417 (Au et al.), U.S. Pat. No. 4,774,024 (Deep et al.), U.S. Pat. No. 4,935,156 (van Konynenburg et al.), U.S. Pat. No. 5,049,850 (Evans et al.), U.S. Pat. No. 5,378,407 (Chandler et al.), U.S. Pat. No. 5,451,919 (Chu et al.), U.S. Pat. No. 5,582,770 (Chu et al.), U.S. Pat. No. 5,747,147 (Wartenberg et al.), U.S. Pat. No. 5,801,612 (Chandler et al.), U.S. Pat. No. 6,130,597 (Toth et al.), U.S. Pat. No. 6,358,438 (Isozaki et al.), and U.S. Pat. No. 6,362,721 (Chen et al.). The disclosure of each of these patents is incorporated herein by reference. Conductive polymer compositions are preferred due to lower resistivity and easier manufacturability than ceramic compositions manifesting PTC behavior.

By the expression "PTC behavior" we mean those compositions that show a sharp increase in resistivity with increasing temperature over a relatively small temperature range. The term "PTC" is used to mean a composition or device that has an $R_{14}$ value of at least 2.5 and/or an $R_{100}$ value of at least 10, and it is preferred that the composition or device should have an $R_{30}$ value of at least 6, where $R_{14}$ is the ratio of the resistivities at the end and the beginning of a 14° C. range, $R_{100}$ is the ratio of the resistivities at the end and beginning of a 100° C. range, and $R_{30}$ is the ratio of the resistivities at the end and the beginning of a 30° C. range.

The PTC resistive element has a thickness, t, which varies depending on the specific application and the resistivity of the conductive polymer composition. In general the thickness, t, is 0.051 to 2.5 mm (0.002 to 0.100 inch), preferably 0.08 to 2.0 mm (0.003 to 0.080 inch), particularly 0.13 to 0.51 mm (0.005 to 0.020 inch), e.g. 0.13 mm or 0.25 mm (0.005 inch or 0.010 inch).

Devices of the invention are most preferably of a substantially flat, rectangular box shape having two major surfaces or faces. These devices include first and second laminar electrodes secured to or defined at the major faces. The electrodes are preferably metal foil electrodes. A first electrode is formed at or secured to a first major face and a second electrode is formed at or secured to a second major face, thereby resulting in a laminar construction. Particularly suitable foil electrodes have at least one surface that is microrough, e.g. electrodeposited, preferably electrodeposited nickel or copper. Appropriate electrodes are disclosed in U.S. Pat. No. 4,689,475 (Matthiesen), U.S. Pat. No. 4,800,253 (Kleiner et al.), U.S. Pat. No. 5,874,885 (Chandler et al.), and U.S. Pat. No. 6,570,483 (Chandler et al.), the disclosure of each of which is incorporated herein by reference. The electrodes may be attached to the resistive element by compression-molding, nip-lamination, or any other appropriate technique. The electrodes may be secured directly to the resistive element or attached by means of an adhesive or tie layer. For some devices it is preferred that the first and second laminar electrodes comprise metal layers formed by directly depositing metal onto the PTC resistive element, e.g. by plating, sputtering, or chemical deposition.

A suitably dimensioned weld plate, typically formed of nickel, is soldered, e.g. by reflow techniques, to one of the first and second laminar electrodes. The weld plate has a thickness, $t_w$, and volume sufficient effectively to absorb the intense heating resulting from a conventional resistance micro-spot welding operation and protect the laminar PPTC device from irreversible damage or destruction. In one presently preferred example described in greater detail below, the weld plate had a thickness of 0.250 mm and the interconnect strap had a thickness of 0.125 mm, thereby demonstrating effectiveness with approximately a two-to-one thickness ratio between the weld plate and strap. On the other hand, the weld plate is made to be sufficiently thin as practical to facilitate rapid transfer of heat from the battery cell to the PPTC device, thereby aiding the overcurrent protection function thereof, and the interconnect strap may be thicker, such as on the order of 0.250 mm, or greater. In this latter case, the interconnect strap may preferably define a longitudinal slit or slot across which micro spot welding current is directed, thereby concentrating melting current in the underlying weld plate.

The other one of the first and second laminar electrodes is adapted to be soldered directly to a printed circuit board or substrate, thereby realizing a weldable battery protection surface mount device (SMD) to which a battery strap may be welded by a battery system user, assembler or integrator using conventional equipment and techniques and without harm or destruction of the PPTC element. Devices of the present invention are particularly useful when making attachment to a battery or to a battery pack containing one or more discrete cells. A battery interconnect strap may extend from a terminal of the battery or cell and be joined by welding to the weld plate of the protection device. Alternatively, terminal electrodes of the battery may extend therefrom and form effective interconnects for resistance welding to weld plates of the protection circuit in accordance with principles of the present invention. Batteries based on any type of battery chemistry may be used, including nickel cadmium batteries, nickel metal hydride batteries, lithium ion batteries, lithium polymer (Li-polymer) batteries, and primary lithium batteries. Battery protection circuits employing devices of the present invention may take a wide variety of forms and topologies, such as shunt regulator circuits of the types exemplified by U.S. Pat. No. 6,518,731 (Thomas et al.), the disclosure of which is incorporated herein by reference.

While the devices of the present invention most preferably receive electrical leads in the form of interconnect straps, other types of PTC circuit protection devices can also benefit from the invention. For example, devices in which metal terminals, e.g. steel, brass, or copper, are attached by means of resistance welding to a chip in order to control the heat dissipation of the device, may be used. Such devices are disclosed in U.S. Pat. Nos. 5,089,801 and 5,436,609 (both Chan et al.), the disclosures of which are incorporated herein by reference. Accordingly, as used herein, the expression "interconnect strap" or "tab" should be construed broadly to cover a wide range of relatively thin, sheet-like metal connectors.

With reference to FIG. 1, a surface-mountable electrical protection device 10 includes a laminar PPTC plaque. The PPTC plaque comprises a layer of PPTC material 12 having a thickness t, a lower foil electrode 14 substantially coextensive with, and bonded to, a lower major face of the layer 12, and an upper foil electrode 16 substantially coextensive with, and bonded to an upper major face of the layer 12. A weld plate 18 is connected to the upper foil electrode 16, preferably by reflow of a thin layer of solder (not shown in the FIG. 1 depiction) in a suitable reflow oven. The weld plate 18 is preferably formed for example of virtually pure nickel, such as nickel 200 alloy or nickel 201 alloy (alloys comprising 99% nickel and sub-one-percent fractions of copper, carbon, manganese, iron, sulfur and silicon, and possibly other elements or impurities, for example). Alternatively, the weld plate may be formed of nickel-plated stainless steel, such as alloy 304 or 316 carrying a 0.1 to 5 µm nickel plating. For example a stainless steel alloy 304 having a 2 µm thick nickel plating on each side is preferred. Other ferrous alloys, or copper alloys, suitable for both soldering and resistance welding and having a suitable thickness, $t_w$, may be used for the weld plate 18.

The weld plate 18 has a predetermined minimum thickness, $t_w$, selected to provide sufficient thermal mass found to be necessary to absorb the thermal energy associated with welding an interconnect strap to an outer major face thereof. Satisfactory results have been realized when the thickness of the weld plate 18 lies in a range of 0.100 to 0.300 mm, and most preferably is approximately 0.250 mm, and wherein an unslotted interconnect strap, also typically of nickel, has a thickness not substantially greater than about 0.125 mm to 0.150 mm. The completed protection device 10 may be provided to a user as the discrete electrical component illustrated in FIG. 1, or it may be combined with other circuit elements on a substrate, such as a printed circuit board as shown in FIG. 3 and then provided to the user, integrator or assembler of a battery pack having protection circuitry.

In a further embodiment of the present invention, the interconnect strap defines a structural opening or feature that forces resistance weld current to flow through the weld plate, and in so doing, through the spot weld contact points between the interconnect strap and the weld plate. This structural opening or feature conventionally takes the form of a slit or a slot in the interconnect strap but can take any effective form, such as an elongated hole or ellipse, etc. Within the context of the present invention, this structural opening or feature enables a thicker interconnect strap effectively to be resistance micro spot welded to the weld plate without significantly increasing the weld energy and weld temperature, and therefore will enable use of the preferred weld plate thickness with interconnect thicknesses greater than 0.125 mm, such as straps having a thickness of 0.250 mm for example.

FIG. 2 illustrates an alternative embodiment of the present invention. Therein, a surface mountable circuit protection device 10A has essentially the same structural elements and arrangement as the device 10 shown in FIG. 1. In addition, the device 10A has a peripheral box 19 of insulative material, such as a formed and cured epoxy, which surrounds and protects the edges of the device 10A from weld splatter or other potentially damaging contaminants. The weld plate 18A has an uncovered elevated central mesa region for welding, and may be formed by using any suitable metal shaping technique, such as stamping, forging, swaging, coining, etc. The overall thermal mass of the weld plate 18A is sufficient to permit welding of the battery strap interconnect without damaging foil layers 14A and 16 and the PPTC layer 12. In this example, the lower foil 14A is preferably extended beyond the edges of the PPTC layer 12 to reach at least to the edges of the surrounding epoxy box 19 to facilitate surface mounting using reflow soldering techniques, for example. Although the central mesa region is shown in FIG. 2 as an elevated region, in some embodiments, depending on the shape of the batter strap interconnect, the region need not raised, merely uncovered by the insulative material.

FIG. 3 shows a circuit board assembly 20 including the surface mount protection device 10 of FIG. 1 being mounted to an appropriately sized connection pad of a printed circuit board 22. Other electrical components such as field effect transistors, diode regulators, resistors, integrated circuits and the like, may also be part of the circuit board assembly 20. Surface mount components 24 and 26 are shown in FIG. 3, and leaded components 28 and 30 are shown in outline form in FIG. 4, for example. The circuit assembly 20 also includes a metal weld plate 32 secured to the board 22 enabling a second battery interconnect strap to be welded thereto, so that an electrical circuit may be completed between the battery or cell and the circuit assembly 20. The second weld plate 32 may have the same or similar thickness, $t_w$, and properties as has the weld plate 18.

FIG. 4A illustrates one particular advantage realized by practice of the present invention. Therein, an interconnect strap 34 is shown to be resistance spot welded to the weld plate 18 of device 10 at spot-weld nodes 35. The strap 34 need not be precisely aligned with the device 10 or circuit assembly 20, and so, it may be welded at a slight angle, as depicted by the dashed outline position of strap 34A, or it may be welded at a right angle relative to a longitudinal axis of the circuit assembly 20, depicted by dashed outline position of strap 34B.

FIG. 4B shows an interconnect strap 34C defining a longitudinal slit. Two resistance micro spot-weld nodes 35 pass through opposite sides of the slitted strap 34C and into the weld plate 18. The slit has a predetermined small width and it enables effective welding of thicker interconnect straps, such as the strap 34C, with resistance weld energy being substantially not greater than the energy required for welding the thinner interconnect straps in accordance with principles of the present invention.

FIG. 5 shows the circuit assembly 20 being connected to a battery/cell 36 by battery interconnect straps 34 and 42. The strap 34 is spot welded to a case of the battery at spot welds 37 and to the weld plate 18 by spot welds 35. A second strap 42 is welded to the plate 32 at spot welds 43 and is welded to a battery terminal 40 at spot welds 41. The straps 34 and 40 not only provide completed circuit connections between the circuit assembly 20 and the battery 36, but also the strap 34 functions to convey heat generated at the battery 36 directly to the PPTC layer 12, thereby enhancing its protection functionality.

Figure 6:
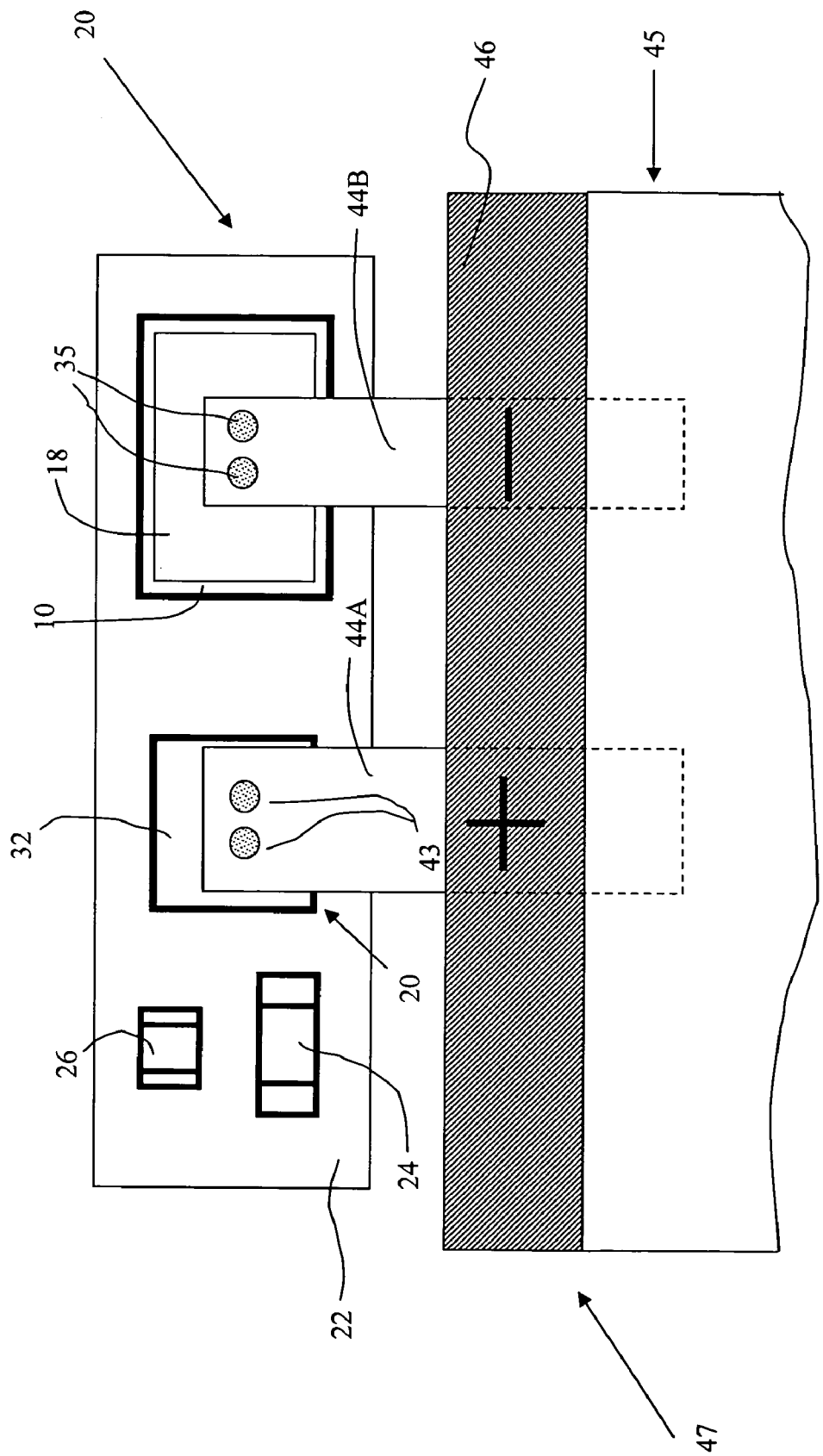
FIG. 6 is an enlarged plan view of a battery protection circuit including weld plates to which cell terminals of a Lithium polymer cell have been resistance micro spot welded.

FIG. 6, illustrating a battery pack assembly 47, shows the circuit protection module 20 connected to a Li-polymer cell 45 by resistance micro spot welding cell terminals or tabs 44A and 44B to plate 32 and weld plate 18 by spot welds 43 and 35, respectively. The cell terminals 44A and 44B exit the cell structure 45 through a sealing zone 46.

The welds are preferably carried out using conventional resistance micro spot welding equipment and techniques. One presently preferred example of a micro spot welding apparatus is a model MSW-412 micro spot welder power supply with a dual tip weld head model VB-S+ZH-32. The weld head force was 2 kgf as monitored by a force pressure monitor, model HCP-20. The power supply model MSW-412, weld head model VB-S+ZH-32, and pressure monitor model HCP-20 are available from Seiwa Manufacturing Co., Ltd., Mitaka High-Tech Center Bldg 8-7-3, Shimorenjaku Mitaka-City, Tokyo, 181-0013 Japan.

Successful welds resulting in little to no damage to the protection device were carried out in devices 10 having weld plate thicknesses of 0.125 mm and 0.250 mm. The interconnect thicknesses were 0.125 mm and 0.100 mm. A weld profile using the micro spot welding apparatus described above and triggered by contact between the weld tips and the strap-weld plate, was a square waveform approximately as follows: 0.0 A for 1 msec, 1.5 A for 1.5 msec, 0.0 A for 9 msec and 2.4 A for 2.3 msec. The resultant weld strengths were measured using 90° peel tests. The effect on the electrical characteristics of the device was measured by comparing the resistances before ($R_{before}$) and after ($R_{after}$) the welding. The following table reports the results:

TABLE

| Weld Plate Thickness, $t_w$ (mm) | Interconnect Thickness (mm) | $R_{before}$ (ohms) | $R_{after}$ (ohms) | Weld Strength (kgf) | Observations |
| --- | --- | --- | --- | --- | --- |
| 0.125 | 0.125 | 0.0059 | 0.0060 | 2.1 | Slight damage, some solder balls |
| 0.125 | 0.100 | 0.0060 | 0.0057 | 0.7 | Slight damage, some solder balls |
| 0.250 | 0.125 | 0.00499 | 0.00505 | >3.5 | Pristine, no damage or solder balls |
| 0.250 | 0.100 | 0.00456 | 0.00466 | >3.5 | Pristine, no damage or solder balls |

With weld plate thicknesses, $t_w$, below 0.125 mm, weld experiments showed significant damage to the protection devices, principally with solder balls being ejected from the solder layer between the weld plate 18 and the upper foil layer 16. Mechanical weld strengths were measured using a 90° peel tests and a force gauge. From the physical observations reported in the right column of the data shown above, it is apparent that the weld plate combinations having a weld plate thickness $t_w$ of 0.250 mm provided excellent results, whereas progressively thinner weld plate thicknesses led to progressively less satisfactory results under the same micro spot welding conditions. A range of weld plate thickness of 0.100 mm and 0.300 mm is presently preferred in carrying out the present invention. While direct current micro spot welding is presently preferred, other welding techniques may be employed in practicing the present invention, such as laser welding, for example. While a single two-spot weld is preferred, multiple two-spot welds or welds using other numbers of weld spots may be employed in accordance with the techniques described above.

Having thus described preferred embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention. Therefore, the disclosures and descriptions herein are purely illustrative and are not intended to be in any sense limiting

What is claimed is:

1. A surface mount circuit protection device comprising:
   (a) a laminar PTC resistive element having first and second major surfaces and a thickness therebetween, said resistive element comprising a conductive polymer composition;
   (b) a first electrode layer formed at the first major surface and being substantially coextensive therewith, and comprising a first metal material of a type adapted to be soldered to a printed circuit substrate for effecting surface mounting of the device;
   (c) a second electrode layer formed at the second major surface and being substantially coextensive therewith;
   (d) weld plate means of metal material formed separately of and extending from the second electrode layer and having a thermal mass capable of withstanding resistance micro spot welding of a strap interconnect means without significant resultant damage to the device, said weld plate means including a raised central mesa region; and
   (e) an insulative box surrounding outer edges of the device and defining an opening exposing the central mesa region.

2. The surface mount circuit protection device set forth in claim 1 wherein the weld plate means has a minimum thickness of 0.100 mm.

3. The surface mount circuit protection device set forth in claim 1 wherein the weld plate means has a thickness in a range of 0.100 mm and 0.300 mm.

4. The surface mount circuit protection device set forth in claim 1 further comprising a printed circuit board assembly to which the device is surface mounted and electrically connected.

5. The surface mount circuit protection device set forth in claim 4 wherein the printed circuit board assembly forms a battery protection circuit module and is mounted to and electrically connected to a battery or cell by battery strap interconnects, one of said battery strap interconnects being micro spot welded to the weld plate means.

6. The surface mount protection device set forth in claim 1 wherein the weld plate comprises one of nickel and nickel-plated stainless steel.

7. A surface mount circuit protection device comprising:
   (a) a laminar PTC resistive element having first and second major surfaces and a thickness therebetween, said resistive element comprising a conductive polymer composition;
   (b) a first electrode layer formed at the first major surface and being substantially coextensive therewith, and comprising a first metal foil layer enabling the device to be surface mounted by solder to a printed circuit;
   (c) a second electrode layer formed at the second major surface and being substantially coextensive therewith, and comprising a second metal foil layer;
   (d) a weld plate of metal material secured to the second metal foil layer and having a volume, thickness and thermal mass sufficient to withstand micro spot welding of a strap interconnect means without significant resultant damage to the device, said weld plate including a raised central mesa region; and
   (e) an insulative box surrounding outer edges of the device and defining an opening exposing the central mesa region.

8. A battery protection circuit assembly including a printed circuit substrate, a plurality of electrical components attached to the printed circuit substrate including a surface mounted circuit protection device comprising:

(a) a laminar PTC resistive element having first and second major surfaces and a thickness therebetween, said resistive element comprising a conductive polymer composition;

(b) a first electrode layer formed at the first major surface and being substantially coextensive therewith, and comprising a first metal foil layer enabling the device to be surface mounted by solder to a printed circuit;

(c) a second electrode layer formed at the second major surface and being substantially coextensive therewith, and comprising a second metal foil layer; and (d) a weld plate of metal material secured to the second metal foil layer and having a volume, thickness and thermal mass sufficient to withstand micro spot welding of a strap interconnect means without significant resultant damage to the device, said weld plate means including a raised central mesa region; and (e) an insulative box surrounding outer edges of the device and defining an opening exposing the central mesa region.

9. The battery protection circuit assembly set forth in claim 8 comprising at least one electrochemical lithium polymer cell, the cell having first and second terminal tabs, wherein at least one of the following conditions applies:

(a) the first tab comprises said strap interconnect means being micro spot welded to the weld plate, and (b) the second tab being connected to circuitry of the printed circuit substrate.

10. The battery protection circuit assembly set forth in claim 8 wherein the weld plate has an area substantially coextensive with a facing surface area of the second metal foil layer and has a thickness in a range of 0.100 mm and 0.300 mm.

11. The battery protection circuit assembly set forth in claim 8 wherein the weld plate comprises one of nickel and nickel-plated stainless steel.

* * * * *